United States Patent [19]

Kubota et al.

[11] Patent Number: 5,043,199

[45] Date of Patent: Aug. 27, 1991

[54] RESIN TABLET FOR PLASTIC ENCAPSULATION AND METHOD OF MANUFACTURING OF PLASTIC ENCAPSULATION USING THE RESIN TABLET

[75] Inventors: Akihiro Kubota; Shitoshi Yoshida, both of Aizuwakamatsu; Shigeru Sato, Nakuchikoshi; Kiyoshi Tunoda; Osamu Yamauchi, both of Aizuwakamatsu, all of Japan

[73] Assignee: Fujitsu Limited, Kawasaki, Japan

[21] Appl. No.: 429,475

[22] Filed: Oct. 31, 1989

[30] Foreign Application Priority Data

Oct. 31, 1988 [JP] Japan .................................. 63-275340

[51] Int. Cl.$^5$ .............................................. B32B 1/06
[52] U.S. Cl. ........................................ 428/76; 428/68; 264/328.5
[58] Field of Search ................. 428/76, 68; 264/328.5, 264/328.4

[56] References Cited

U.S. PATENT DOCUMENTS 3,320,397  5/1967  Alexander et al. .............. 264/328.5

Primary Examiner—Alexander S. Thomas
Attorney, Agent, or Firm—Staas & Halsey

[57] ABSTRACT

The present invention provides a resin tablet for plastic encapsulation molding by the transfer molding process. A tablet body is obtained by compressing powdered thermosetting resin and is covered by a covering membrane. A method of manufacturing a plastic encapsulation using such a resin tablet includes exposing the surface of tablet body by breaking the covering membrane in a pot and pressing the thermosetting resin of exposed tablet body with the plunger for encapsulated molding.

8 Claims, 7 Drawing Sheets

RESIN TABLET FOR PLASTIC ENCAPSULATION AND METHOD OF MANUFACTURING OF PLASTIC ENCAPSULATION USING THE RESIN TABLET

BACKGROUND OF THE INVENTION

1. Field of the Invention

The present invention relates to a resin tablet used for plastic encapsulation of semiconductor devices and a method of manufacturing a plastic package such as a resin encapsulated semiconductor device using such resin tablet.

In the manufacture of resin encapsulated semiconductor devices, that is, plastic package semiconductor devices, resin encapsulation is effected by transfer molding techniques using a resin tablet obtained by compressing a powdered resin for molding as the supply material.

In transfer molding, since a molding die pot is used as the molding material supply port and the molding resin is transferred therefrom to the molding die resin path with the pressure in the plunger engaged with the pot, the supply material is tablet-shaped so that it fits to supply the pot.

In conventional molding, resin tablets, which are formed only by compressing the powder of thermosetting resin for molding with the resin exposed, are used as the supply material.

Therefore, when this resin tablet touches other objects, the resin powder easily separates and leaps away from the surface of tablet. Accordingly, when this resin tablet used, the powder scatters and is adheres to every corner during delivery to the molding die pot. This powder soils workers' hands during manual processing. In addition, the powder also causes electric contacts of molding die to fail, and leads to erroneous recognition of photosensor. The powder also tends to adhere to a new resin tablet, after curing, and enters the resin to be transferred during the molding process, resulting in a problem that the molding quality is deteriorated.

For this reason, if it is attempted to take a measure for the process of transfer molding, it is extremely difficult so long as the conventional resin tablet is used.

In addition, the resin tablet is formed in the specified resin condition mixing the base resin, hardening agent, filler and other additives and it provides a problem that if it is taken out from the encapsulation package and is left for a while, quality declines due to absorbed humidity, which leads to a deterioration of molding quality of encapsulating package. Therefore, the resin tablet which has been left for the predetermined period after the hermetically sealed package is opened is no longer used and it is desirable that the resin tablet can further be used even after the capsule is opened and the resin is left for a long period (for instance, half day to several days) under ambient conditions.

SUMMARY OF THE INVENTION

It is therefore an object of the present invention to provide resin tablets which do not allow scattering of powder from the thermosetting resin for encapsulated molding.

It is another object of the present invention to provide resin tablets which can prevent, for a long period, deterioration of quality of the thermosetting resin.

It is another object of the present invention to provide a method of manufacturing a plastic encapsulation which can obtain a high quality plastic encapsulation.

In the present invention, the object described above can be achieved by a resin tablet to be used for molding plastic encapsulation by transfer molding, comprising a tablet body which has been obtained by compressing the powder of thermosetting resin and a covering membrane which covers the surface of tablet body.

Moreover, in the present invention, the object mentioned above can be achieved by a method of manufacturing a plastic encapsulation comprising the steps of:

(a) supplying a resin tablet, in which the surface of tablet body obtained by compressing the powder of thermosetting resin is covered with a covering membrane, to the die pot for transfer molding;

(b) the exposing the surface of the tablet body by breaking the covering membrane of resin table within the pot; and (c) molding the plastic encapsulation by pressing with a plunger the resin tablet taken out from the covering membrane, supplying the thermosetting resin of the tablet body to the plastic encapsulation molding part of transfer molding die and then hardening the resin through the heating process.

DESCRIPTION OF THE PREFERRED EMBODIMENT

Figure 1:
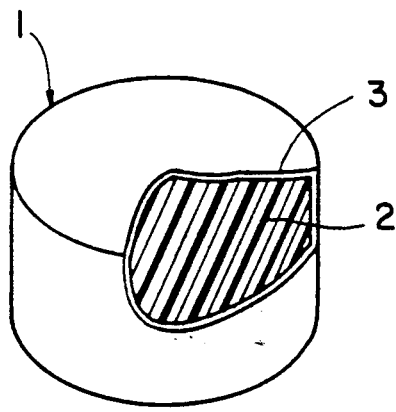
FIG. 1 is a partially cutaway view in perspective of the resin tablet as an embodiment of the present invention.

A resin tablet as an embodiment of the present invention is shown in FIG. 1.

The resin tablet 1 shown in FIG. 1 is formed by covering a tablet body 2 which has been obtained by compressing the powder of thermosetting resin for molding consisting of cresol novolac epoxy resin, novolac phenol resin as the thermosetting agent, silica as the filling agent, inflamable agent and catalyst with a membrane 3 consisting of flexible material such as heatproof silicon rubber under the expanding condition.

This resin tablet 1 does not allow scattering of internal resin powder unless the rubber membrane 3 is broken. Moreover, since the rubber membrane 3 has nondust generative property, it never generates dust from rubber membrane 3 if it touches objects. Accordingly, a dust proofing property can be achieved using the resin tablet 1 as the supply material.

Moreover, since the rubber membrane 3 does not lose elasticity even when it is heated up to the molding die temperature (for example, 170° C.) during the molding, if any part is broken, the membrane shrinks exposing the greater part of surface of the tablet body 2. This property may be utilized, as will be described later, for the molding process.

In the case of this resin tablet 1, because the tablet body 2 is covered with a membrane 3 such as rubber, quality deterioration of resin of tablet body 2 can be prevented and the tablet body 2 can be exposed easily by supplying the tablet to the die.

The tablet body 2 of the resin tablet 1 is cylindrically shaped and has a diameter of 10~20 mm and height of 10~30 mm and the edge part thereof has the round shape so that the rubber membrane 3 shrinks easily. The rubber membrane 3 has the thickness of several μm to several tens of μm.

Next, an example of the method for manufacturing the resin tablet 1 will be explained with reference to FIG. 10A~FIG. 10H.

Figure 10A:
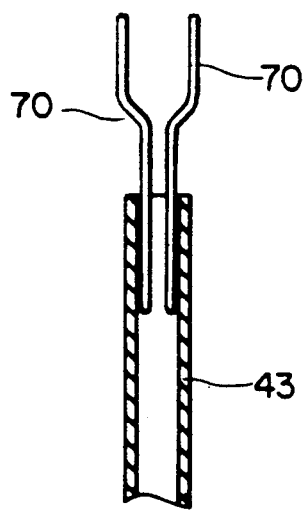
FIGS. 10A~10H show processes for manufacturing the resin tablet shown in FIG. 1 as the embodiment of the present invention.
Figure 10B:
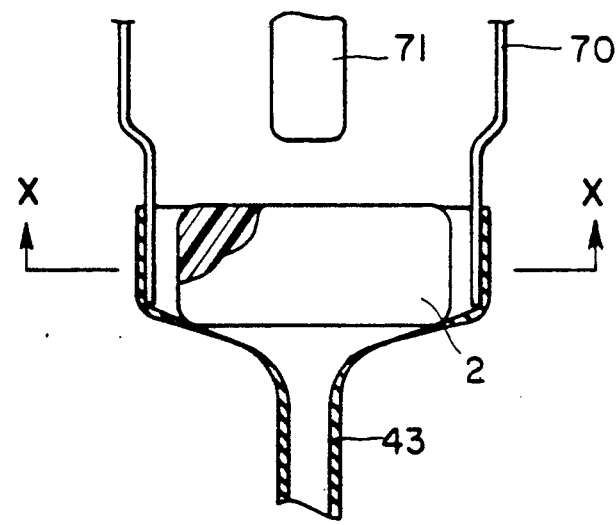

As shown in FIG. 10A, the four rods 70 of expansion jig are inserted into one end of a tube 43 made of silicon rubber. The end of rubber tube 43 is widened with such rods as shown in FIG. 10B and the tablet body 2 is placed therein. FIG. 10C is a sectional view of X—X plane of FIG. 10B.

Figure 10D:
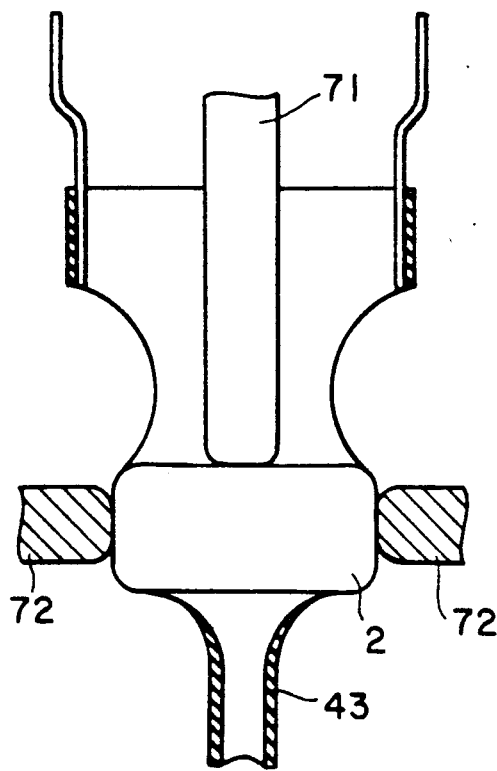
Figure 10C:
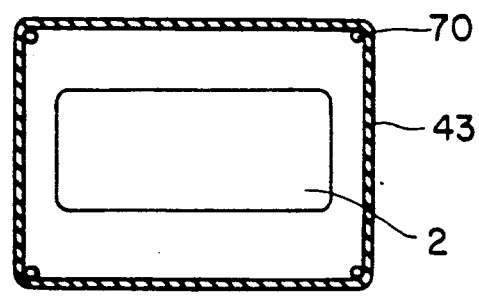
Figure 10E:
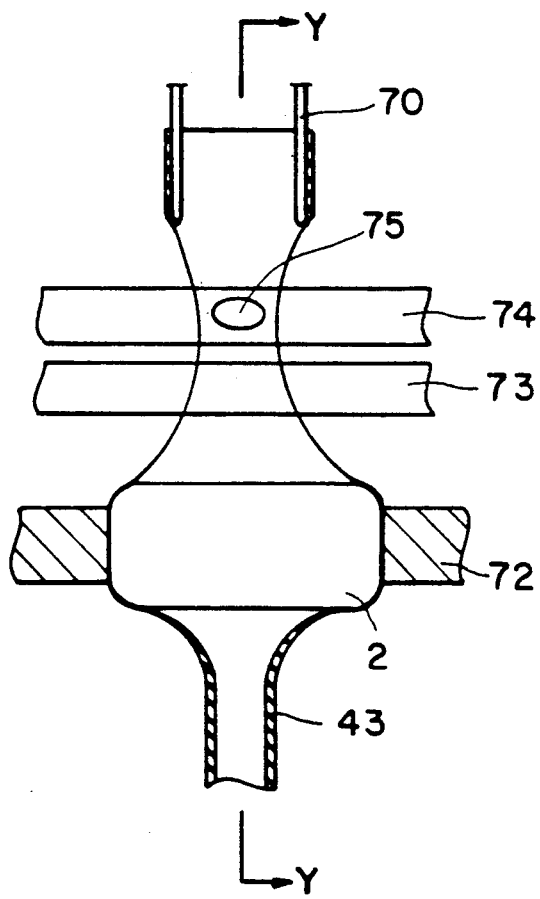
Figure 10F:
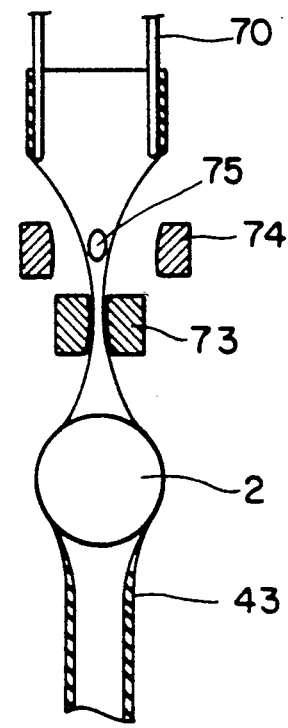
Figure 10G:
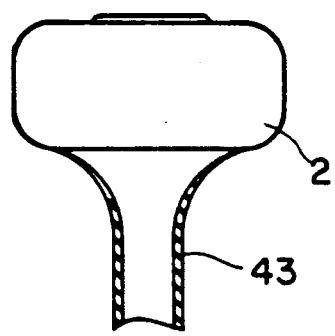
Figure 10H:
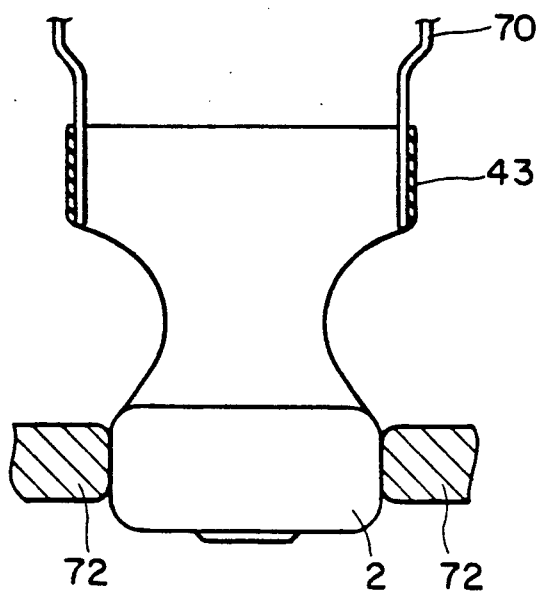

Next, as shown in FIG. 10D, the tablet body 2 is pushed with a rod 71 to the deeper area of rubber tube 43 and is then fixed with a chuck 72 through the expanded rubber. Thereafter, the rod 71 is withdrawal, and the width of the four rods 70 is narrowed. After the four rods are further moved backward, and the rubber is fastend by the first clamper 73 as shown in FIG. 10E and FIG. 10F indicating the Y—Y plane of FIG. 10E. The material 75 obtained by dissolving unvulcanized silicon rubber with a solvent such as toluene is then put into the tube. This area is then fastened by a second clamper 74, and these areas are bonded for encapsulation. Thereafter, the rubber tube 43 is cut at the bonding areas and thereby the rubber shrinks as shown in FIG. 10G. The sealed rubber tube 43 of the opposite side is cut in a predetermined length, and the tablet body 2 is fixed with the chuck 72 as shown in FIG. 10H. The rubber tube 43 is then widened with the rods 70 and encapsulation is then effected as explained previously.

Figure 2:
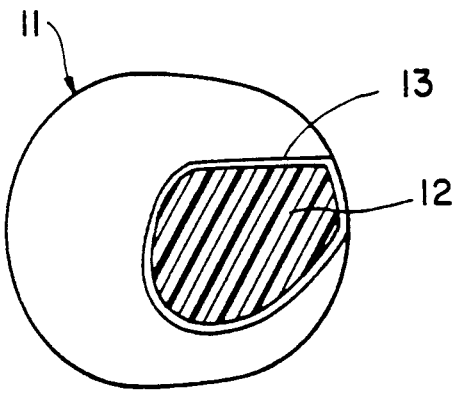
FIG. 2 is a partially cutaway view in perspective of the resin tablet as an another embodiment of the present invention.

Another embodiment of the present invention will be shown in FIG. 2.

The resin tablet 11 is composed of a tablet body 12 and a membrane 13 made of a flexible material covering such tablet body like the resin tablet shown in FIG. 1. The tablet body 12 of this resin tablet 11 is formed more spherically than that of FIG. 1.

Figure 3:
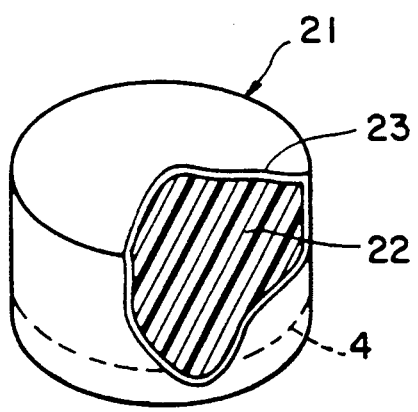
FIG. 3 is a partially cutaway view in perspective of the resin tablet as the other embodiment of the present invention.

The resin tablet 21 of another embodiment of the present invention shown in FIG. 3 comprises a tablet body 22 and a dustproof paper 23 as the covering membrane with easily tearable part, for example, score line 4 provided to the area on the dustproof paper 23 opposed to the resin flowing path of molding die.

This score line 4 defines an easily tearable area of dustproof paper 23, and is frangible by internal pressure when pressure is applied to the tablet body 22. Therefore, such means is not limited only to the score line so long as the easily tearable area can be defined. For instance, it is possible to make the dustproof paper tearable easily by making an area thinner than the other parts.

This resin tablet 21 prevents scattering of resin powder by the dustproof paper 23 and realizes dustproof measure as explained previously like the preceding resin tablet 1 in combination with the nondust generative property of dustproof paper 23.

The heatproof property and score line 4 of the dustproof paper 23 may be used, as described later, for the molding process.

Figure 4:
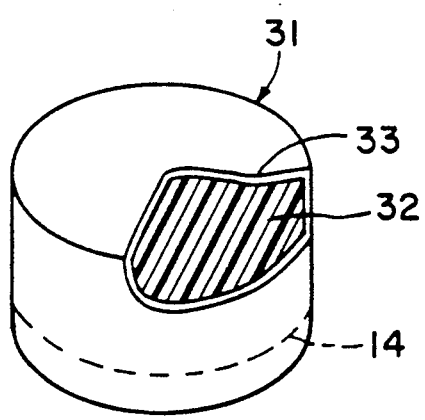
FIG. 4 is a partially cutaway view in perspective of the resin tablet of still another embodiment of the present invention.

The resin tablet 31 shown in FIG. 4 as another embodiment of the present invention utilizes aluminum foil 33 in place of the dustproof paper 23 of the resin tablet 21 and also provides a score line 14 like the resin tablet 21.

This resin tablet 31 also realizes a dustproof quality as explained above and has a nondust generative property which is inherent to aluminum foil. The aluminum foil 33 makes difficult the high frequency preheating of resin tablet 31 but is very effective for to keep humidity out of the tablet body 23.

The heatproof characteristic and score line 14 of aluminum foil 33 may be used, as described later, in the molding process.

The material of membrane covering the tablet bodies 22, 23 such as the dustproof paper in FIG. 3 or aluminum foil 33 in FIG. 4 may be replaced with a proper heatproof metal foil or heatproof plastic material. The score line 14 may also be replaced by other easily tearable means.

Next, a method of manufacturing a plastic encapsulation of the present invention will be explained.

Figure 5A:
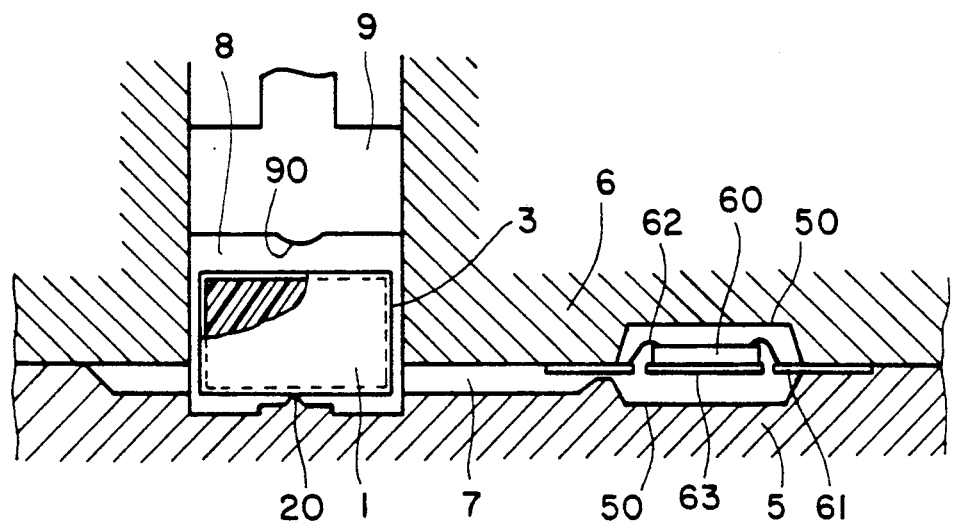
FIG. 5A and FIG. 5B are vertical sectional views showing the operating conditions of die for transfer molding to explain the method of manufacturing semiconductor device as an embodiment of the present invention using the resin tablet shown in FIG. 1.
Figure 5C:
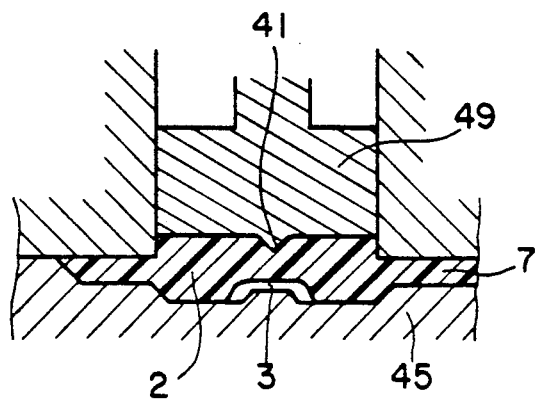
FIG. 5C is a vertical sectional view showing the operating condition of another die for transfer molding.
Figure 5B:
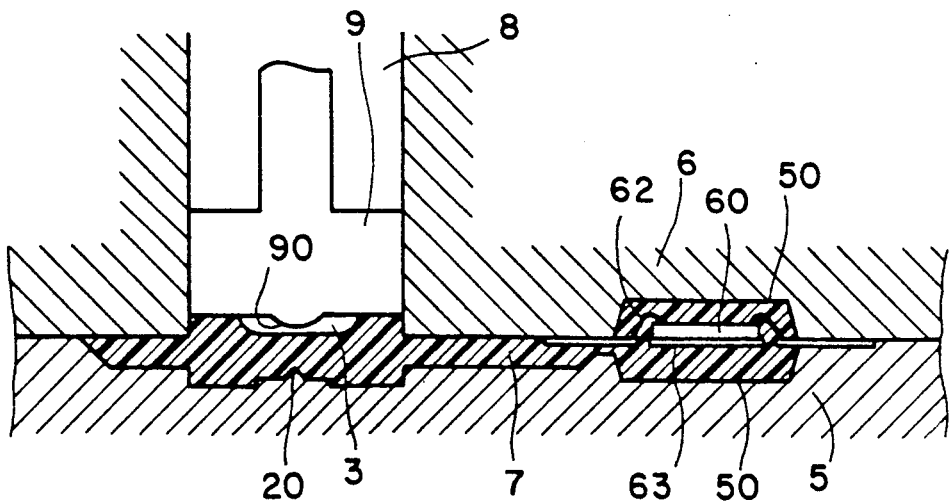

FIG. 5A and FIG. 5B show an embodiment utilizing the resin tablet 1 shown in FIG. 1. FIG. 5A shows the condition before transfer of resin, while FIG. 5B, the condition after transfer of resin.

In FIG. 5A and FIG. 5B, the reference numeral 5 designates a lower die of a molding apparatus; 6, an upper die; 7, resin flowing path called a runner; 50, cavity; 8, pot to which the resin tablet is supplied and 9, a plunger for pressing the resin tablet.

Since the resin tablet 1 is used, a projected blade 20 for breaking the rubber membrane 3 of resin tablet 1 is provided at the center of bottom part of a pot 8 of lower die 5. A semiconductor chip 60 is provided in the cavity 50, and is bonded to a stage 63 and connected to the lead 61 with a wire 62 interposed between the lower die 5 and upper die 6.

In the manufacturing method of the present invention, the resin tablet is first supplied to the pot 8 as shown in FIG. 5A. The resin tablet 1 supplied to the pot 8 is in such a condition that the tablet body 2 is covered with the rubber membrane 3. The plunger 9 is then caused to move downward pressing the resin tablet. Thereby, the rubber membrane 3 is cut by the blade 20 and momentarily shrinks to be concentrated to the upper surface of tablet body 2, exposing the lower part and side surfaces of tablet body 2. Thereafter, the plunger 9 is pressed continuously, causing the resin of tablet body 2 to flow into the runner 7 and thereby the resin encapsulated molding is carried out as shown in FIG. 5B. Here, the resin of tablet body 2 is heated up to the temperature, for example, 170° C. so that it is hardened. The rubber membrane 3 remains within the pot 8 without scattering.

In this case, it is allowed that the blade 20 is formed very sharp and when the resin tablet 1 is supplied to the pot 8, that is, before the resin tablet 1 is pressed by the plunger 9, the rubber membrane 3 may be broken.

Accordingly, in this molding process, the resin encapsulated molding for semiconductor device can be realized without flowing of rubber membrane 3 into the runner 7, thus avoiding a problem unique to the present resin encapsulation process.

Here, if the plunger 9 is provided with a projection 90, the rubber membrane is preferably shrunken towards the part pressed by the projection 90 when the rubber membrane 3 is broken.

As shown in FIG. 5C, a blade 41 may be provided on the plunger 49 at the part pressing the resin tablet 1. Only the behavior of rubber membrane 3 is vertically reversed, while the other elements function the same as those described above. In this case, a blade is not provided on the lower die 45. It is more preferable to provide the blade on the lower die than on the plunger because in the former case the rubber membrane is separated far from the entrance of the resin runner and the rubber membrane will never easily impede flow into the resin runner.

Figure 7A:
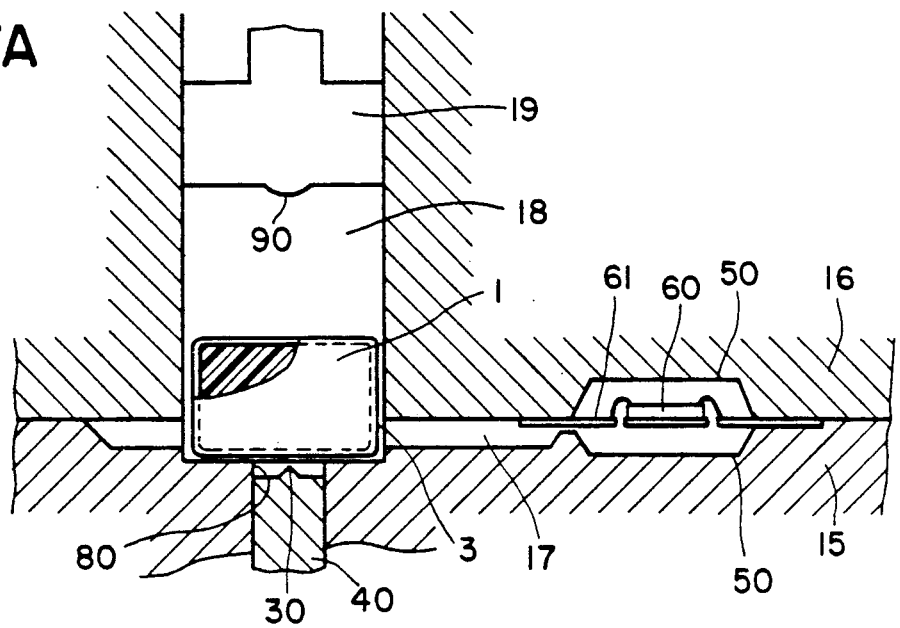
FIG. 7A, FIG. 7B, FIG. 7C are vertical sectional views showing the operating conditions of still another die for transfer molding to explain the method of manufacturing semiconductor device as an embodiment of the present invention.
Figure 7B:
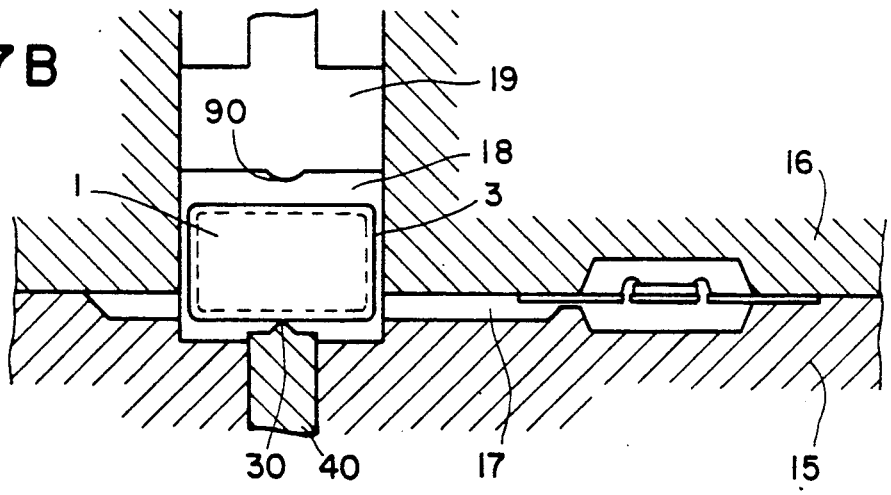
Figure 7C:
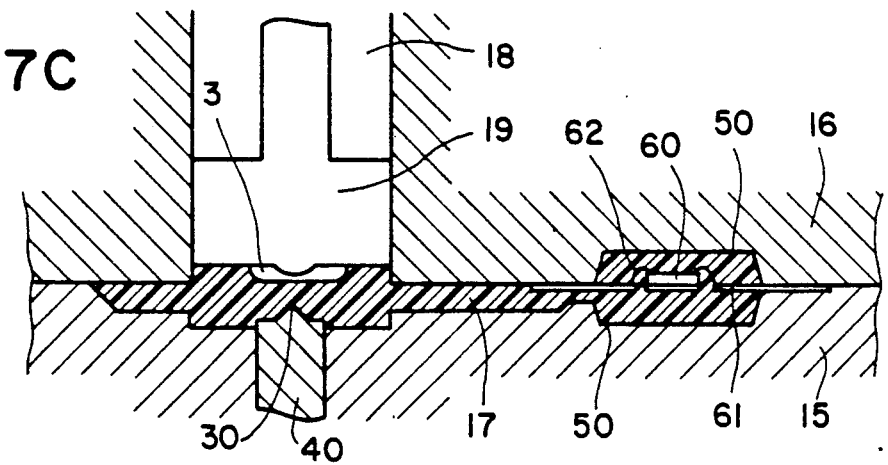

FIG. 7A, FIG. 7B, and FIG. 7C show the method of manufacturing a plastic encapsulation as in the other enbodiments of the present invention. In these figures, 15 designates a lower die; 16, an upper die; 17, resin runner; 18, a pot; 19 a plunger and 90, a projection. An aperture 80 is provided to the pot 18 of lower die 15 and a movable part 40 providing a blade 30 is built into the aperture 80.

As shown in FIG. 7A, the resin tablet 1 is supplied into the pot under the condition that the movable part 40 is moved downward and thereby the end part of blade 30 becomes lower than the lower surface of pot 18.

Next, as shown in FIG. 7B, the movable part 40 is lifted until the resin tablet 1 touches the blade 30. The plunger 19 is then moved downward and the resin tablet 1 is pushed. The rubber membrane 13 in contact with the blase is broken with the pushing pressure When the plunger 19 is further moved downward, the encapsulated molding is carried out as shown in FIG. 7C.

In case the blade 30 is moved downward in the supply process of resin tablet 1, the rubber membrane 3 is not broken when the plunger 19 is not pushed during the supply of tablet but such membrane is broken when the plunger 19 is pushed. Therefore, the rubber membrane 3 is shrinked to the area pushed by the plunger 19. This is preferable because the rubber membrane 3 will never easily impede the resin runner.

Figure 6:
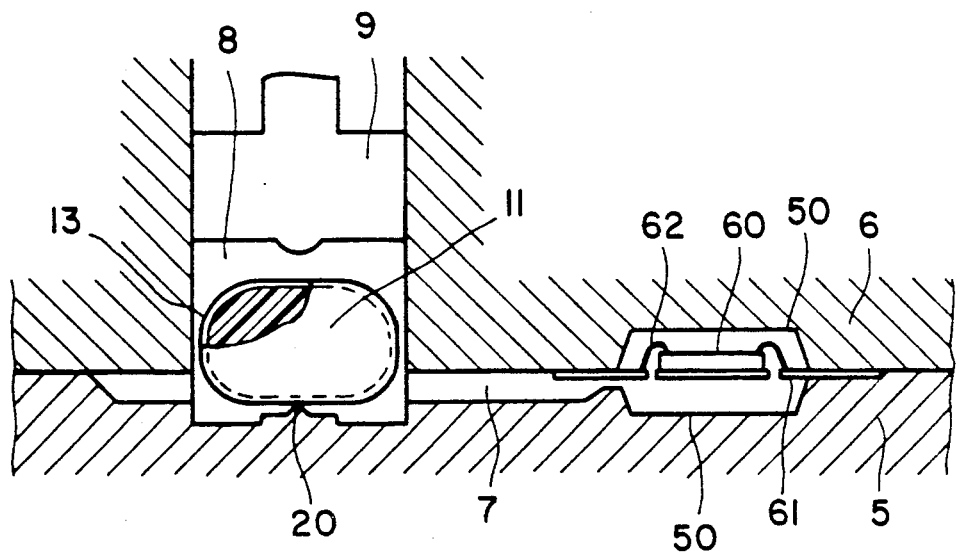
FIG. 6 is a vertical sectional view showing the operating condition of die for transfer molding to explain the method of manufacturing semiconductor device as an embodiment of the present invention using the resin tablet shown in FIG. 2.

FIG. 6 shows an example of the method for manufacturing a plastic encapsulation using the resin tablet 11 comprising the tablet body 12 shown in FIG. 2 which is formed rather spherically. This resin tablet 11 is used in the manner as the resin tablet 1.

Figure 8A:
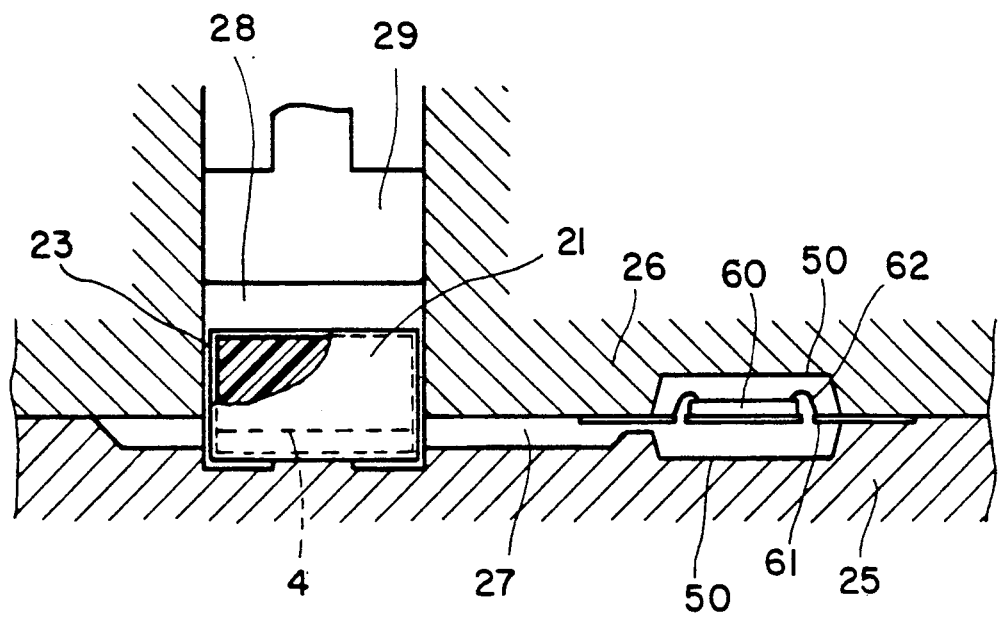
FIG. 8A and FIG. 8B are vertical sectional views showing the operating conditions of die for transfer molding to explain the method of manufacturing semiconductor device as another embodiment of the present invention using the resin tablets shown in FIG. 3 and FIG. 4.
Figure 8B:
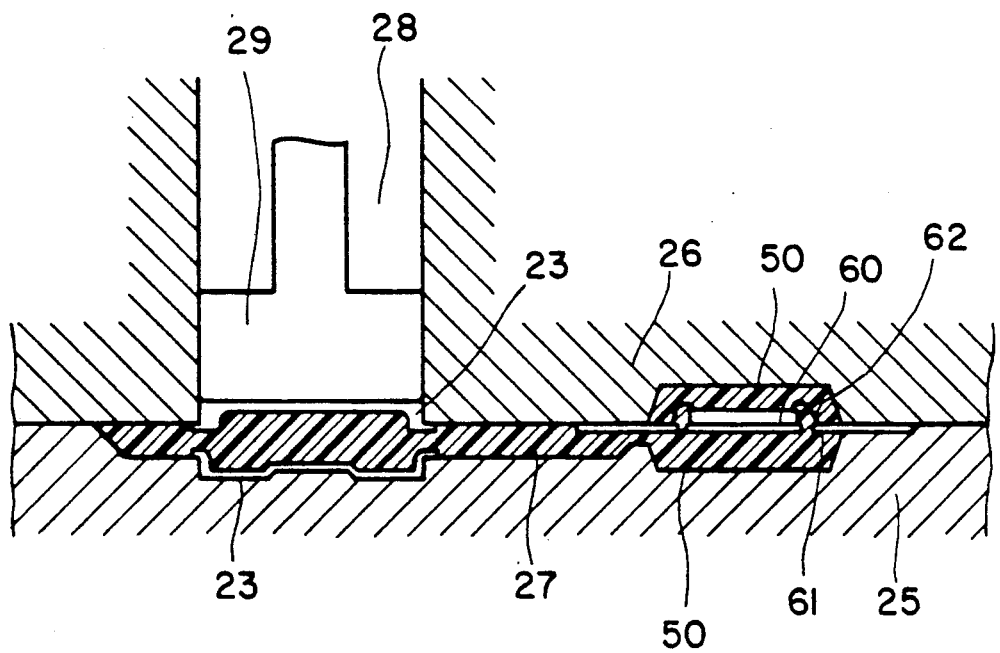

Still further embodiment of the present invention is shown in FIG. 8A and FIG. 8B.

In these figures, 25 designates a lower die of molding die; 26, an upper die; 27, resin runner; 50, a cavity; 28, a pot to which the resin tablet is supplied; and 29, a plunger for pressing the resin tablet. Here, the resin tablet 21 or 31 shown in FIG. 3 and FIG. 4 is used.

In this case, the blade 20 or 41 which has been used for the resin tablet 1 or 11 is unnecessary.

In this manufacturing method, as shown in FIG. 8A, the resin tablet 21 is supplied to the pot 28. The easy tearable part such as score line 4 provided in the covering membrane 23 which covers the table body 22 of the resin tablet 21 supplied to the pot 28 is located opposed to the resin runner 27.

Next, the plunger 29 is moved downward pressing the resin tablet 21 and thereby the score line 4 is broken, exposing the tablet body 22.

Thereafter, the plunger 29 is continuously moved downward pressing the resin tablet 21 and thereby allowing the resin of tablet body 22 to flow into the resin runner 27. The resin encapsulated molding is carried out as shown in FIG. 8B. In FIG. 8B, the resin of table body 22 is heated by the die and is then hardened. The membrane 23 is not separated and remains within the pot 28.

Therefore, in this molding process, resin encapsulating of the semiconductor device can be realized without inflow of the covering membrane 23 such as dustproof paper into the resin runner 27, thus avoiding a problem unique to the resin encapsulating process.

Figure 9A:
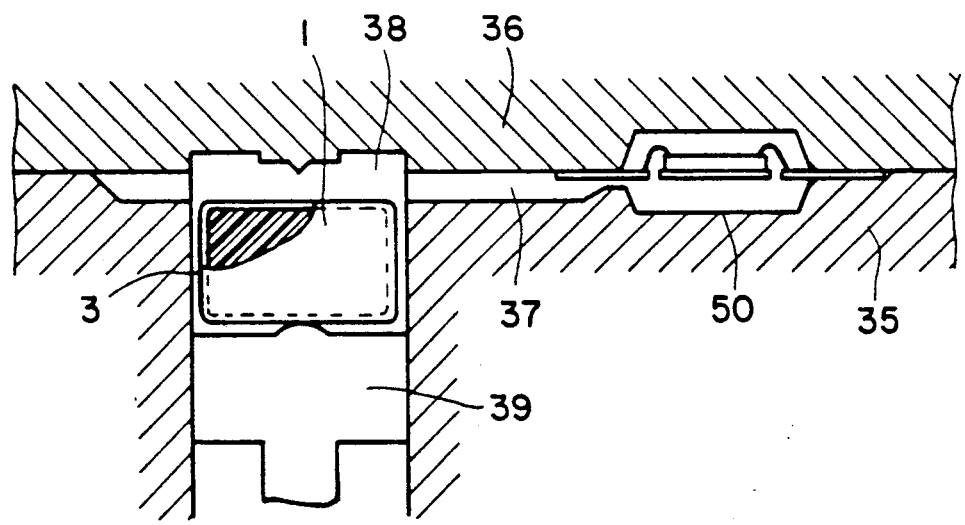
FIG. 9A and FIG. 9B are vertical sectional views showing the operating conditions of still another die for transfer molding to explain the method of manufacturing semiconductor device as another embodiment of the present invention.
Figure 9B:
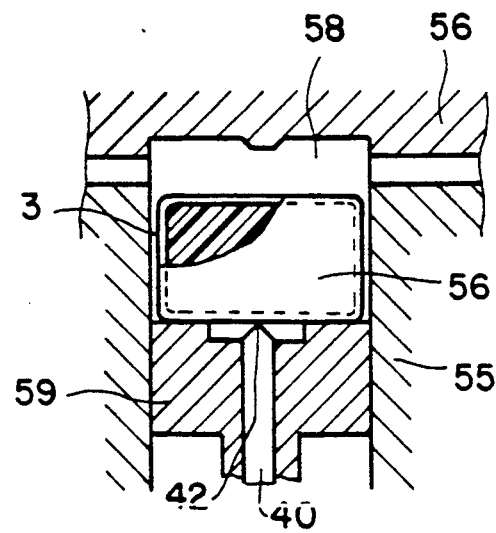

Each embodiment described above uses the molding die in such a form that the plunger moves downward in the upper die but it is also possible to employ the molding die of the form that the plunger moves downward in the lower die. An example of this form is shown in FIG. 9A and FIG. 9B. In FIG. 9A, the blade 20 is provided to the upper die 36, while in FIG. 9B, the blade 42 is provided to the plunger 59. The covering membrane 3 such as rubber is broken by pressing it with the plunger 39 or 59. In FIG. 9B, the blade 42 is located at the recessed area on the upper surface of plunger 59 and the end part of blade 42 is a little lower than the upper end surface of plunger so that the covering membrane 3 is not broken during supply of the resin tablet 1.

In FIG. 9A and FIG. 9B, the molding die providing the blade is used but the molding die not providing the blade is used for the resin tablets 21, 31 shown in FIG. 3, FIG. 4.

While the present invention has been described with respect to specific embodiments thereof, it is to be understood that the present invention is not limited thereto in any way but covers any and all changes and modifications which will become possible within the scope of the claims.

What is claimed is:

1. A resin tablet used for molding a plastic encapsulation by transfer molding, comprising:

a tablet body made of compressed, powdered thermosetting resin, and a covering membrane covering the surface of said tablet body.

2. A resin tablet according to claim 1, wherein said covering membrane is made of an elastic material and covers the surface of said tablet body while placed in an extended condition.

3. A resin tablet according to claim 2, wherein said elastic material is made of rubber.

4. A resin tablet according to claim 2, wherein said tablet body is cylindrically shaped with rounded edge portions.

5. A resin tablet according to claim 1, wherein said covering membrane is made of a film having a frangible portion.

6. A resin tablet according to claim 5, wherein said membrane is made of paper and said frangible portion is a score line.

7. A resin tablet according to claim 5, wherein said membrane is made of a metal foil and said frangible portion is a score line.

8. A resin tablet according to claim 5, wherein said membrane is made of a heatproof plastic.

* * * * *